(12) United States Patent
Kurz et al.

(10) Patent No.: US 10,242,949 B2
(45) Date of Patent: Mar. 26, 2019

(54) ARRANGEMENT FOR SPATIALLY LIMITING A RESERVOIR FOR A MARKER MATERIAL

(71) Applicant: OSRAM Opto Semiconductors GmbH, Regensburg (DE)

(72) Inventors: Christian Kurz, Regensburg (DE);
Sven Gerhard, Alteglofsheim (DE);
Andreas Löffler, Neutraubling (DE);
Jens Müller, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 2 days.

(21) Appl. No.: 15/566,423

(22) PCT Filed: Apr. 14, 2016

(86) PCT No.: PCT/EP2016/058255
§ 371 (c)(1),
(2) Date: Oct. 13, 2017

(87) PCT Pub. No.: WO2016/166235
PCT Pub. Date: Oct. 20, 2016

(65) Prior Publication Data
US 2018/0102323 A1    Apr. 12, 2018

(30) Foreign Application Priority Data

Apr. 15, 2015 (DE) .................. 10 2015 105 752

(51) Int. Cl.
*H01L 23/544*    (2006.01)
*H01L 33/00*    (2010.01)
*H01L 33/38*    (2010.01)
*H01S 5/022*    (2006.01)

(52) U.S. Cl.
CPC ........ *H01L 23/544* (2013.01); *H01L 33/0095* (2013.01); *H01L 33/38* (2013.01); *H01S 5/02268* (2013.01); *H01L 2223/5442* (2013.01); *H01L 2223/5448* (2013.01); *H01L 2223/54426* (2013.01); *H01L 2223/54433* (2013.01); *H01L 2223/54493* (2013.01)

(58) Field of Classification Search
None
See application file for complete search history.

(56) References Cited

U.S. PATENT DOCUMENTS

| 3,720,309 | A | * | 3/1973 | Weir | ............... | B07C 5/344 |
| | | | | | | 156/250 |
| 6,186,609 | B1 | * | 2/2001 | Huang | ............... | B41J 3/00 |
| | | | | | | 347/2 |
| 7,265,567 | B2 | * | 9/2007 | Quinton | ............... | H01L 23/544 |
| | | | | | | 257/E23.179 |

(Continued)

*Primary Examiner* — Jaehwan Oh
(74) *Attorney, Agent, or Firm* — DLA Piper LLP (US)

(57) ABSTRACT

An arrangement includes a confining layer, a metallization layer and a semiconductor component, wherein the metallization layer is arranged on the semiconductor component, and the confining layer is arranged on the metallization layer, the confining layer spatially establishes a reservoir for the marker material at least partially in a defined manner, the confining layer and the metallization layer include an identical material, and the marker material is arranged in the reservoir of the arrangement.

20 Claims, 7 Drawing Sheets

(56) References Cited

U.S. PATENT DOCUMENTS

| | | | | |
|---|---|---|---|---|
| RE44,579 E * | 11/2013 | Pendse | ................... | H01L 21/563 257/734 |
| 9,318,457 B2 * | 4/2016 | Topacio | ............ | H01L 23/49866 |
| 9,418,913 B2 * | 8/2016 | Shim | ....................... | H01L 23/48 |
| 9,679,811 B2 * | 6/2017 | Pendse | ............. | H01L 21/76885 |
| 2003/0148342 A1 * | 8/2003 | Gau | ................... | B01L 3/502715 435/6.11 |
| 2004/0005181 A1 * | 1/2004 | Liu | ................... | H01L 21/67282 400/175 |
| 2006/0159838 A1 * | 7/2006 | Kowalski | ............... | B82Y 30/00 427/58 |
| 2007/0263862 A1 * | 11/2007 | Tseng | ................ | H05K 1/0269 380/51 |
| 2010/0164097 A1 * | 7/2010 | Pendse | .................. | H01L 21/563 257/737 |
| 2011/0074022 A1 * | 3/2011 | Pendse | .................. | H01L 21/565 257/737 |
| 2011/0074026 A1 * | 3/2011 | Shim | ................... | H01L 21/4846 257/737 |
| 2011/0076809 A1 * | 3/2011 | Pendse | .................. | H01L 21/563 438/127 |
| 2011/0121464 A1 * | 5/2011 | Pendse | .................. | H01L 21/563 257/775 |
| 2011/0133334 A1 * | 6/2011 | Pendse | .................. | H01L 21/563 257/737 |
| 2011/0248399 A1 * | 10/2011 | Pendse | .................. | H01L 21/563 257/737 |
| 2011/0304058 A1 * | 12/2011 | Pendse | ................. | H05K 3/3436 257/778 |
| 2012/0126416 A1 * | 5/2012 | Lee | ....................... | H01L 21/563 257/774 |
| 2012/0153462 A1 * | 6/2012 | Wakiyama | ............ | H01L 21/563 257/737 |
| 2012/0164797 A1 * | 6/2012 | Lowenthal | ............ | H01L 25/048 438/127 |
| 2013/0049190 A1 * | 2/2013 | Topacio | ................... | H01L 24/05 257/737 |
| 2015/0340334 A1 * | 11/2015 | Topacio | ................... | H01L 24/05 257/737 |

* cited by examiner

ARRANGEMENT FOR SPATIALLY LIMITING A RESERVOIR FOR A MARKER MATERIAL

TECHNICAL FIELD

This disclosure relates to an arrangement that spatially limits a marker material reservoir.

BACKGROUND

To mark arrangements arranged on wafers, in an ink process, marker material is applied onto that arrangement which is defective and subsequently rejected. The marker material is used so that the arrangement can be automatically detected by an optical image acquisition device and automatically rejected.

There is nonetheless a need to provide an improved arrangement.

SUMMARY

We provide an arrangement including a confining layer, a metallization layer and a semiconductor component, wherein the metallization layer is arranged on the semiconductor component, and the confining layer is arranged on the metallization layer, the confining layer spatially establishes a reservoir for the marker material at least partially in a defined manner, the confining layer and the metallization layer include an identical material, and the marker material is arranged in the reservoir of the arrangement.

We also provide a method of producing the arrangement including a confining layer, a metallization layer and a semiconductor component, wherein the metallization layer is arranged on the semiconductor component, and the confining layer is arranged on the metallization layer, the confining layer spatially establishes a reservoir for the marker material at least partially in a defined manner, the confining layer and the metallization layer include an identical material, and the marker material is arranged in the reservoir of the arrangement including providing a wafer and a plurality of arrangements on the wafer, checking each arrangement for functionality on the wafer, introducing the marker material into the reservoir of the arrangement which is defective or functional to mark the defective arrangement or the functional arrangement, selecting a filling quantity of the marker material such that a maximum volume of the reservoir is not exceeded, detecting the arrangements on the wafer by an optical image acquisition device, distinguishing the arrangement with marker material in the reservoir from arrangements without marker material in the reservoir, separating the individual arrangements from one another by sawing the wafer, and discriminating the marked arrangement from the unmarked arrangement.

LIST OF REFERENCES 1 wafer
10 arrangement
15 marker material
20 semiconductor component
21 first outer contour
25 metallization layer
30 second outer contour
35 confining layer
40 first side face
45 second side face
50 surface of the confining layer
55 upper side of the semiconductor component
60 confining edge
65 margin
70 reservoir
75 spreading
80 chamfer
100 first metallization layer
105 second metallization layer
110 second outer contour
115 third outer contour
200 first confining web
205 second confining web
210 first confining face
215 second confining face
220 upper side of the metallization layer
225 section
h height
b width
a distance
α angle
β angle
415 first section of the confining edge
420 second section of the confining edge
425 third section of the confining edge
430 fourth section of the confining edge
435 edge

DETAILED DESCRIPTION

We discovered that an improved arrangement may be provided by the arrangement having a confining layer, a metallization layer and a semiconductor component. The metallization layer is arranged on the semiconductor component, and the confining layer is arranged on the metallization layer. The confining layer is designed to spatially establish a reservoir for a marker material at least partially in a defined manner, the confining layer and the metallization layer comprising an identical material.

By establishing the reservoir in a defined manner, it is also possible to establish a spatial extent of the marker material in a defined manner so that particularly reliable detection of the arrangement by the image acquisition device in the ink process is ensured. In this way, manual finishing and/or cross-contamination of marker material running over the arrangements can be avoided. Furthermore, the confining layer and the metallization layer can be produced economically, in particular by an etching method or a deposition method.

The confining layer may laterally comprise a side face and a surface on the upper side. The side face and the surface form a confining edge. The confining edge at least partially delimits the reservoir. In this way, the confining layer can be configured to be particularly flat.

The side face may have an extent perpendicularly to the surface with a value of 0.1 µm to 4 µm, particularly 0.3 µm to 4 µm, particularly 0.5 µm to 2 µm, particularly advantageously 0.5 µm to 1.5 µm. This ensures that the marker material can also be held in the liquid state by its surface tension on the confining edge, and even a margin of spreading of the marker material beyond the confining edge does not enter into contact with the metallization layer lying underneath.

The metallization layer may have an outer contour, the outer contour having a margin beyond the confining edge, the margin having a width with a value of 1 µm to 5 µm, particularly 2 µm to 8 µm, particularly advantageously 2 µm to 4 µm. This ensures that the marker material comes to lie on the metallization layer even if the marker material runs over the confining edge. Although this leads to a reduction in the detectability by the optical image acquisition device, it nevertheless ensures that further arrangements arranged on the wafer are not contaminated by the marker material.

The confining layer may comprise a confining web. The confining web extends in a direction facing away from the semiconductor component. The confining web at least partially delimits the reservoir. Particularly in the event of strong vibrations introduced into the arrangement, the confining web ensures that the marker material cannot flow out of the reservoir so that the arrangement is transportable even with liquid marker material.

The metallization layer may have an outer contour, the confining web lying at a distance from the outer contour with a value of 0 µm to 20 µm, advantageously 5 µm to 15 µm, particularly advantageously 5 µm to 10 µm.

The confining web may have a width with a value of 0.1 µm to 0.8 µm. This avoids unintentional deformation of the confining web.

The confining web may have a height of 0.1 µm to 2 µm, particularly 0.2 µm to 1 µm, particularly advantageously 0.1 µm to 0.5 µm. This ensures sufficient coverage on the surface of the metallization layer by the marker material.

The confining web may laterally comprise a confining face, the confining face making an angle with the metallization layer, the angle having a value of 40° to 90°, particularly 60° to 90°, particularly advantageously 70° to 90°.

The semiconductor component may be an optoelectronic semiconductor component and, for example, comprises a laser diode.

The marker material may comprise, for example, one of the following materials: ink, epoxy resin, adhesive, water, plastic.

The marker material may have a viscosity of 300 mPa*s to 500 mPa*s.

The above-described properties, features and advantages, as well as the way in which they are achieved, will become more clearly and readily comprehensible in conjunction with the following description of the examples, which will be explained in more detail in connection with the drawings.

Figure 1:
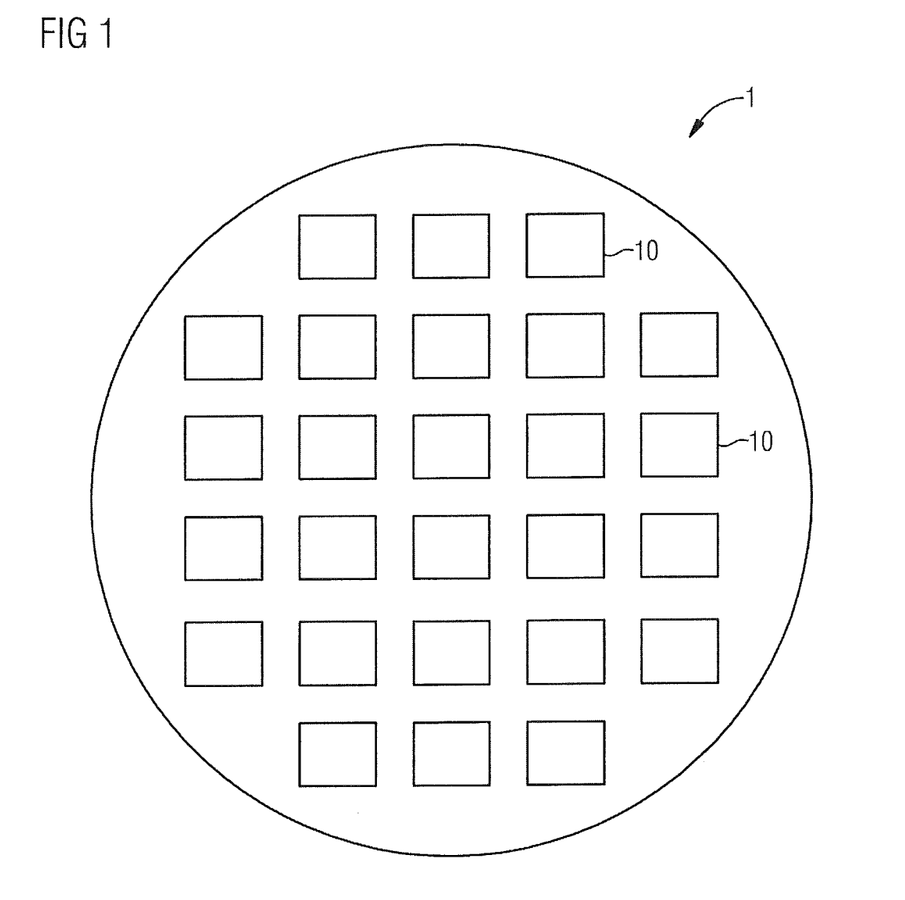
FIG. 1 represents a plan view of a wafer having a plurality of arrangements.

FIG. 1 shows a plan view of a wafer 1. The wafer 1 comprises a plurality of arrangements 10. The arrangements 10 are arranged at a regular distance from one another.

Figure 2:
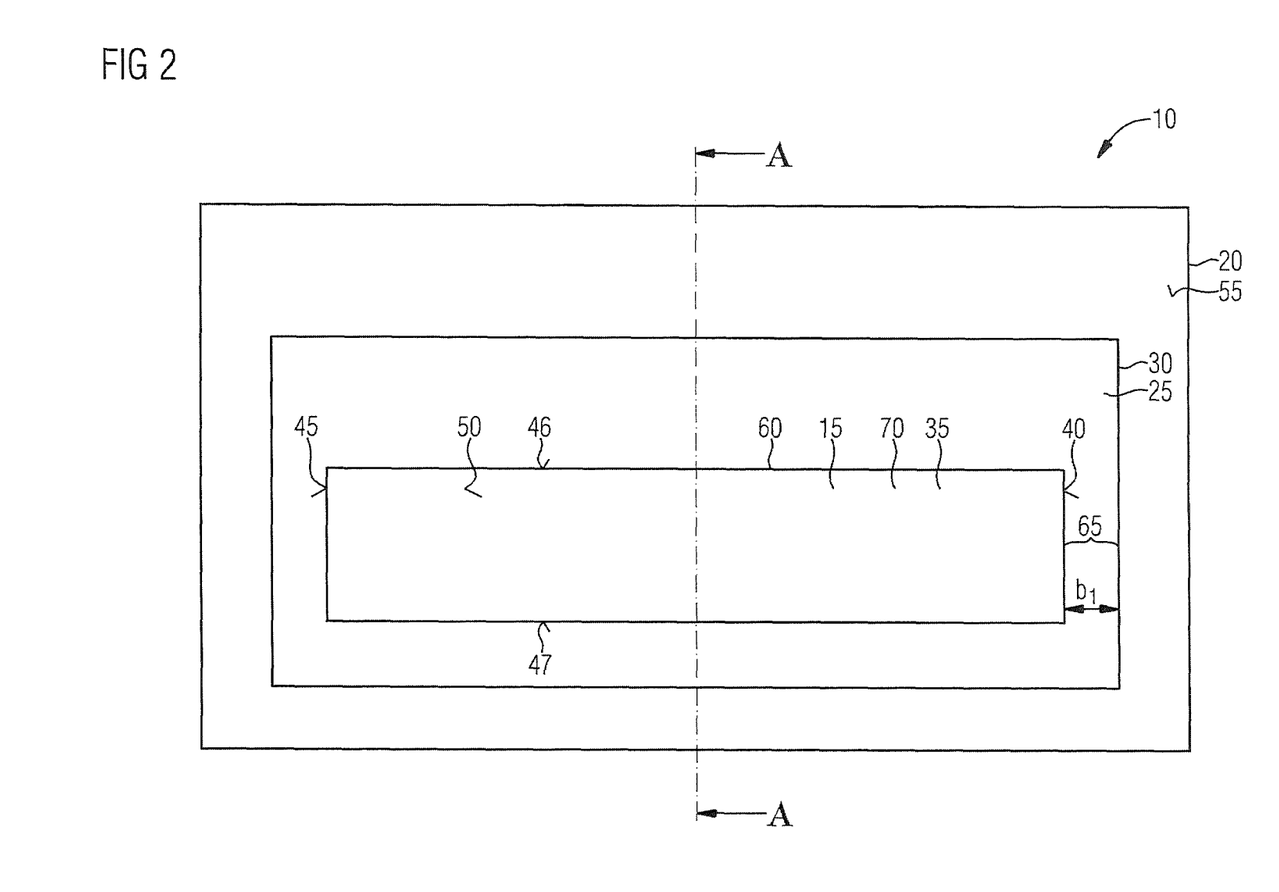
FIG. 2 represents a plan view of an arrangement according to a first example.

FIG. 2 shows a plan view of an arrangement 10.

The arrangement 10 comprises a semiconductor component 20. In the example, the semiconductor component 20 is an optoelectronic semiconductor component 20. The semiconductor component 20 comprises, for example, at least one laser diode that emits electromagnetic radiation, for example, a laser light. The semiconductor component 20 has a first outer contour 21. The first outer contour 21 is rectangular.

The arrangement comprises a metallization layer 25, a confining layer 35 and marker material 15.

The metallization layer 25 is arranged on an upper side 55 of the semiconductor component 20. The metallization layer 25 is used to contact the semiconductor component 20. To this end, the metallization layer 25 is configured to be electrically conductive and, for example, comprises at least one metal. The metallization layer 25 has a second outer contour 30. The second outer contour 30 is, for example, rectangular. The second outer contour 30 may also be adapted according to the configuration of the semiconductor component 20. The second outer contour 30 may have any other shape.

The confining layer 35 is arranged on the upper side on the metallization layer 25. The confining layer 35 and the metallization layer 25 comprise, for example, the same material. The metallization layer 25 and/or the confining layer 35 may, for example, be applied onto the semiconductor component 15 by means of a deposition method.

The confining layer 35 is, for example, configured rectangularly, and laterally comprises a first side face 40, a second side face 45, a third side face 46 and a fourth side face 47. The first side face 40 is arranged opposite and parallel to the second side face 45. The third side face 46 is arranged at a right angle to the first and second side faces 40, 45. The fourth side face 47 is arranged opposite and parallel to the third side face 46. The side faces 40, 45, 46, 47 may also have a different orientation to one another.

On the upper side, the confining layer 35 has a surface 50. The surface 50 is configured to be planar and, for example, arranged parallel to the upper side 55 of the semiconductor component 20.

Figure 3:
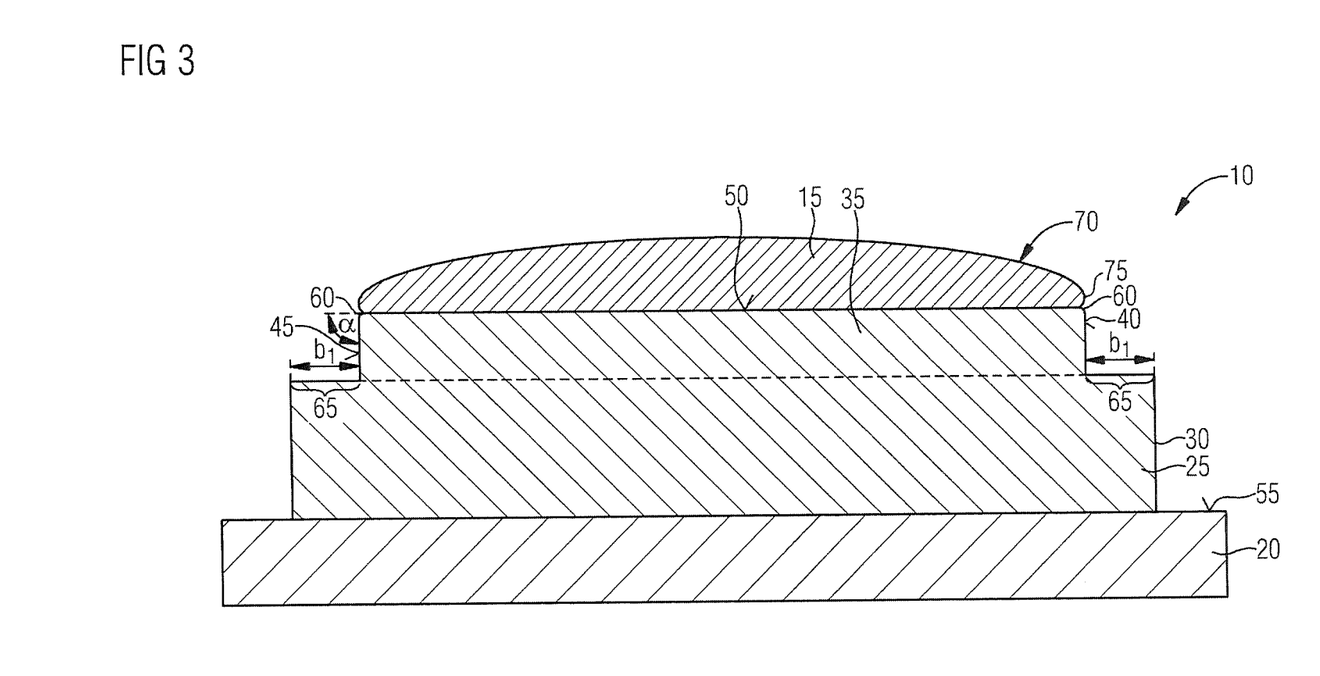
FIG. 3 represents a sectional view through the arrangement shown in FIG. 2 along a section plane A-A shown in FIG. 2.

FIG. 3 shows a sectional view through the arrangement 10 shown in FIG. 2 along a section plane A-A shown in FIG. 2.

The semiconductor component 20 and the metallization layer 25 have, for example, a rectangular cross section. A thickness of the metallization layer 35 is in this case greater than the confining layer 24.

The side face 40, 45, 46, 47 is arranged inclined relative to the surface 50. The side face 40, 45, 46, 47 encloses an angle α with the surface 50, the angle α having a value of 40° to 90°, particularly 60° to 90°, particularly advantageously 70° to 90°. In the example, the side face 40, 45, 46, 47 is oriented perpendicularly to the surface 50.

The side face 40, 45, 46, 47 and the surface 50 meet one another and form a confining edge 60. The confining edge 60 may be configured as a structural edge, for example, as a ridge edge of a semiconductor laser. The confining edge 60 may also be as a material transition between the confining layer 24 and a further component laterally meeting the side face 40, 45, 46, 47. The confining edge 60 laterally delimits a reservoir 70 for the marker material 15. The surface 50 of the confining layer 35 delimits the reservoir 70 on the lower side. The reservoir 70 is open upward. The surface tension of the marker material 15 and/or of a viscosity of the marker material 15 assists formation of the reservoir 70.

The second outer contour 30 of the metallization layer 25 has a margin 65 beyond the confining edge 60. Because of the margin 65, the confining edge 60 is arranged offset inward relative to the outer contour 30. The margin 65 has, for example, a width $b_1$ with a value of 1 μm to 15 μm, particularly 2 μm to 8 μm, particularly advantageously 2 μm to 4 μm.

The side face 40, 45, 46, 47 has an extent e perpendicularly to the surface 50 of the confining layer 35 with a value of 0.1 μm to 4 μm, particularly 0.3 μm to 4 μm, particularly 0.5 μm to 2 μm, particularly advantageously 0.5 μm to 1.5 μm. This ensures that the marker material 15 is also held in the liquid state by its surface tension at the confining edge 60 in the reservoir 70, and the marker material 15 does not enter into contact with the metallization layer 35 lying underneath even if spreading 75 of the marker material 15 beyond the confining edge 60 occurs.

During production of the arrangement 10, a plurality of arrangements 10 are produced together on the wafer 1. After production, the arrangements 10 are checked for functionality on the wafer 1. To distinguish the functional arrangements 10 from defective arrangements 10, in a so-called "ink process," marker material 15 is introduced into the reservoir 70 of the arrangement 10 which is defective to mark the defective arrangement 10. Of course, it would also be possible to introduce marker material 15 into the reservoir 70 of that arrangement 10 which is functional. In this case, a filling quantity of the marker material 15 is selected such that a maximum volume of the reservoir 70 is not exceeded.

The marker material 15 may, for example, comprise one of the following materials: ink, epoxy resin, adhesive, water, plastic. It is in this case particularly advantageous for the marker material 15 to have a viscosity with a value of 300 mPa*s to 500 mPa*s. This prevents the marker material 15 from flowing away laterally beyond the confining edge 60 and being arranged exclusively on the upper side of the surface 50 of the confining layer 35.

Subsequent to this, the arrangements 10 on the wafer 1 are detected by an optical image acquisition device (not represented). In this case, the image acquisition device can distinguish the arrangements 10 with marker material 15 in the reservoir 70 from the arrangements 10 without marker material 15 in the reservoir 70.

After detection of the arrangements 10 on the wafer 1, the individual arrangements 10 are separated from one another by sawing the wafer 1. Due to the discrimination of the marked arrangements 10 from unmarked arrangements 10, the defective and marked arrangements 10 can be rejected.

Due to the provision of the confining layer 35 on the metallization layer 25, the confining layer 35 can be configured freely so that the image acquisition device can better detect those arrangements 10 in which marker material 15 is applied onto the arrangement 10. Furthermore, during sawing of the wafer 1, a sawing apparatus can be controlled precisely due to the improved detection of the marked arrangement 10.

Furthermore, provision of the confining layer 35 ensures free configuration of the confining layer 35 in relation to the metallization layer 25. Because of this, the reservoir 70 for the marker material 15 can be adapted in a way that the image acquisition device can detect particularly well the arrangements 10 marked with marker material 15.

Although lateral spreading 75 of the marker material 15 at the confining edge 60 can occur when filling the reservoir 70 because of the confining edge 60 in combination with the surface tension and the extent of the side face 40, 45, 46, 47 transversely to the surface 50, flow of the marker material 15 over the confining edge 60 is however avoided.

Figure 4:
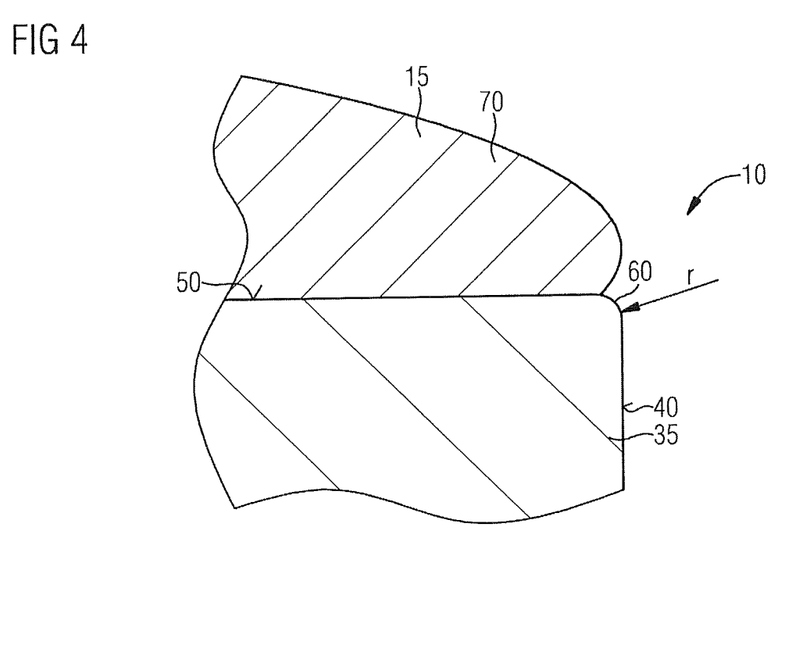
FIG. 4 represents a detail of a sectional view of one example of the arrangement shown in FIGS. 2 and 3.

FIG. 4 shows a detail of a sectional view of one refinement of the arrangement 10 shown in FIGS. 2 and 3. The arrangement 10 is essentially identical to the arrangement 10 shown in FIGS. 2 and 3. In addition, the confining layer 35 has a radius r at least in sections at the confining edge 60. The radius r may in this case have a value of 0.01 μm to 0.05 μm.

Figure 5:
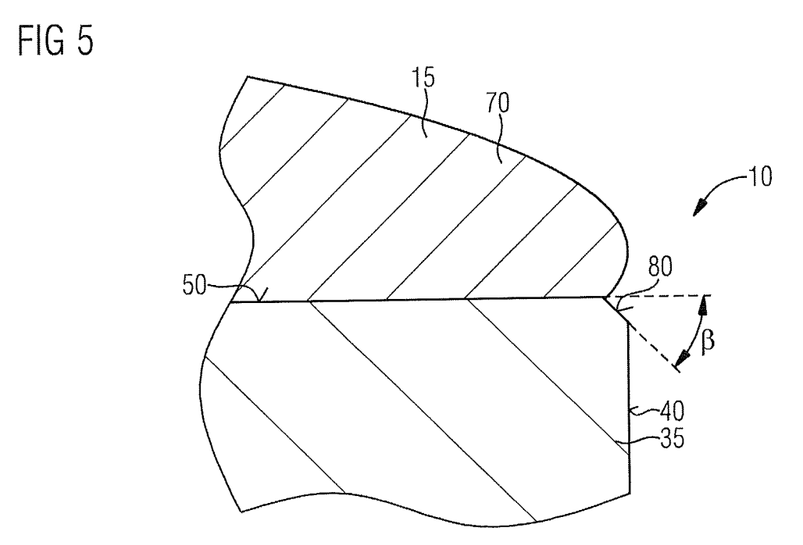
FIG. 5 represents a detail of a sectional view of a further example of the arrangement shown in FIGS. 2 and 3.

FIG. 5 shows a detail of a sectional view of another example of the arrangement 10 shown in FIGS. 2 and 3. The arrangement 10 is essentially identical to the arrangement 10 shown in FIGS. 2 and 3. In addition, the confining layer 35 has a chamfer 80 at least in sections at the confining edge 60. The chamfer 80 may in this case have an angle β of 0° to 45° with respect to the surface 50 of the confining layer 35.

Figure 6:
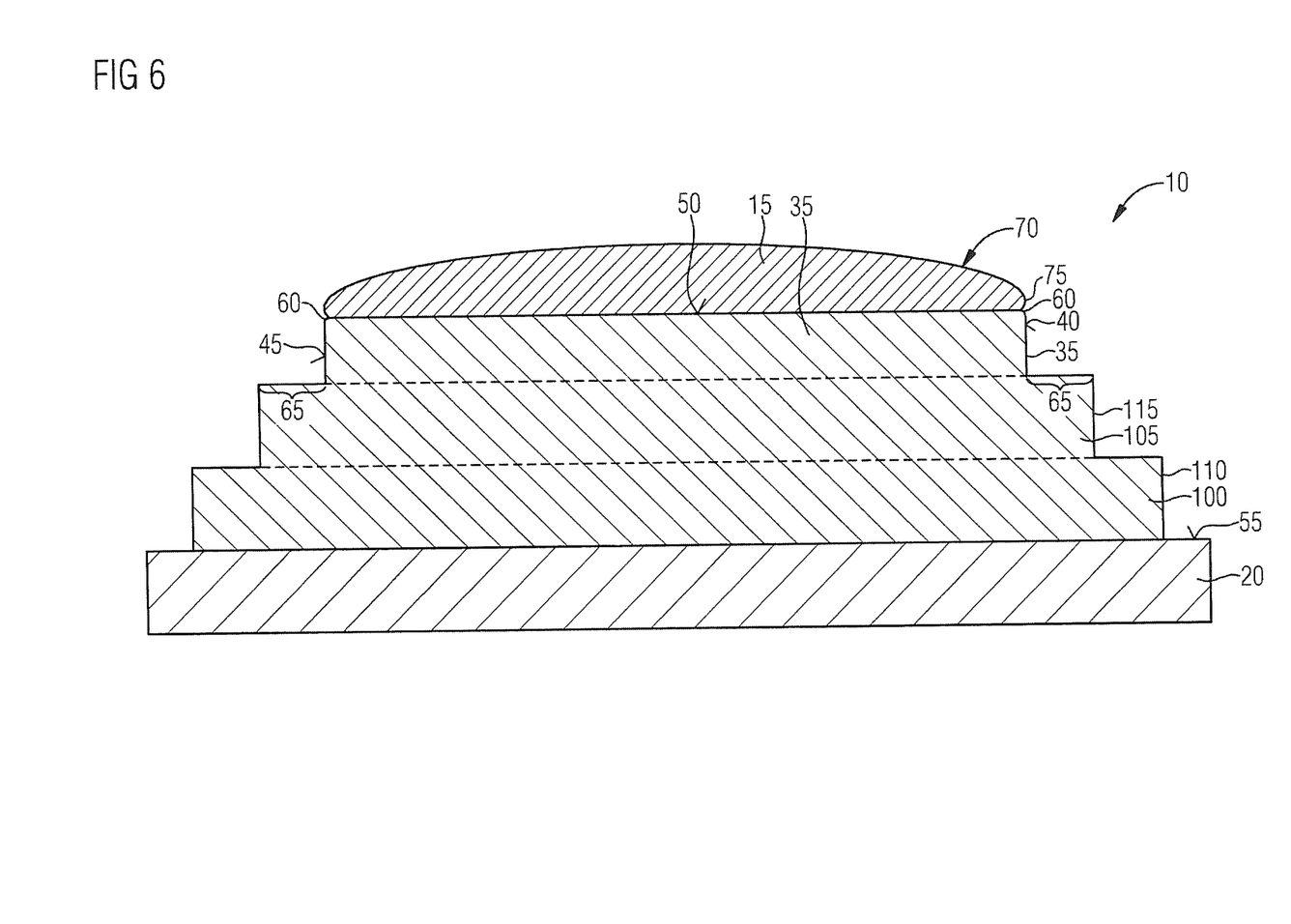
FIG. 6 represents a sectional view through a further example of the arrangement shown in FIGS. 2 and 3.

FIG. 6 shows a sectional view through a further example of the arrangement 10 shown in FIGS. 2 and 3.

The arrangement 10 differs from the arrangement 10 shown in FIGS. 2 and 3 in that the arrangement 10 comprises a first metallization layer 100 arranged on the upper side 55 of the semiconductor component 20, and a second metallization layer 105. The second metallization layer 105 is arranged on the upper side of the first metallization layer 100. The confining layer 35 is arranged on the upper side on the second metallization layer 105.

The first and second metallization layers 100, 105 have, for example, a rectangular cross section. The first metallization layer 100 has a second outer contour 110, and the second metallization layer has a third outer contour 115. The second outer contour 110 is selected such that the second outer contour 110 extends inside the first outer contour 21. The third outer contour 115 is selected such that it lies inside the second outer contour 110 so that the second metallization layer 105 has a smaller extent than the first metallization layer 100 in an extent direction parallel to the upper side 55 of the semiconductor component 20.

In the example, the first metallization layer 100, the second metallization layer 105 and the confining layer 35 are, for example, configured to be differently thick in a direction perpendicular to the surface 50 of the semiconductor component 20.

The confining layer 35 has a margin 65 extending beyond the third outer contour 115 of the second metallization layer 105. The arrangement 10 therefore has a configuration stepped upward in a cascaded manner from the semiconductor component 20.

Due to the provision of a plurality of metallization layers 100, 105 and the confining layer 35, the metallization layer 100, 105 can respectively be configured in terms of its electrical properties, while on the other hand the confining layer 35 can be adapted in relation to its geometry and/or its structure for the ink process. Furthermore, the configuration of the arrangement 10 stepped in a cascaded manner additionally avoids, if the marker material 15 were to flow from the confining layer 35 onto the second metallization layer 105, the second metallization layer 105 acting as a further confining layer and preventing further arrangements 10, arranged adjacent to the arrangement 10 on the wafer 1, onto which no marker material 15 is intended to be applied, being contaminated by marker material 15 flowing onto them.

Figure 7:
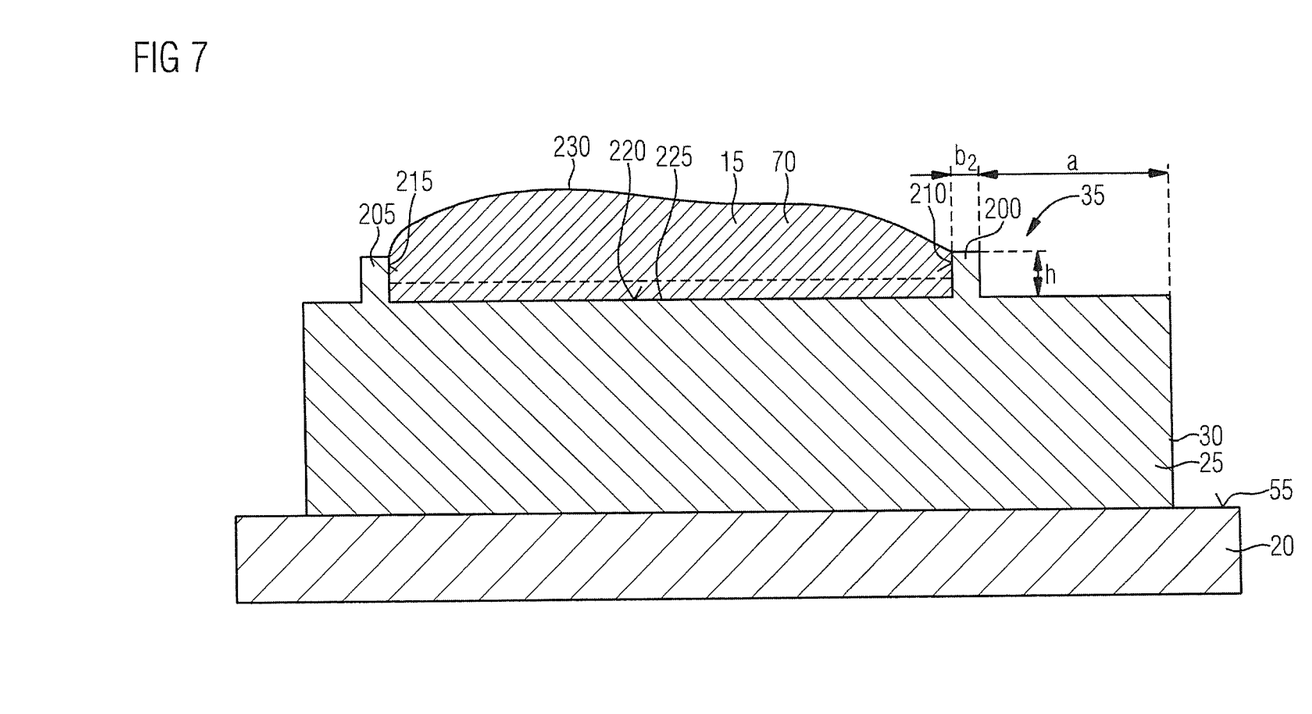
FIG. 7 represents a sectional view through an arrangement according to a second example.

FIG. 7 shows a sectional view through an arrangement 10 according to a second example. The arrangement 10 is configured similarly to the arrangement 10 shown in FIGS. 2 to 5. In contrast thereto, the confining layer 35 has a first confining web 200 and a second confining web 205. The confining web 200, 205 is arranged on the upper side on the metallization layer 25. The confining web 200, 205 extends in a direction facing away from the semiconductor component 20. Each confining web 200, 205 has a rectangular cross section.

The first confining web 200 has a laterally arranged first confining face 210, and the second confining web 205 has a laterally arranged second confining face 215. The first confining face 210 is in this case arranged opposite the second confining face 215. The confining faces 210, 215 and an upper side 220 of the metallization layer 25 in this case delimit the reservoir 70. The reservoir 70 is open upward.

In the example, the first confining web 200 and the second confining web 205 are configured identically, and arranged extending fully around the reservoir 70. The first confining web 200 and the second confining web 205 may also be configured differently from one another. Furthermore, a further section 225 of the confining layer 35 may be provided (shown by dashes in FIG. 7), which connects the first confining web 200 to the second confining web 205 and is arranged on the upper side of the metallization layer 25.

The confining web 200, 205 is arranged at a lateral distance a from the second outer contour 30 of the metallization layer 25 with a value of 0 µm to 20 µm, advantageously 5 µm to 15 µm, particularly advantageously 5 µm to 10 µm. The distance a of the confining web 200, 205 from the second outer contour 30 ensures that, even in the event of unintentional flow of marker material 15 beyond the confining web 200, 205, the metallization layer 25 acts particularly well as a flow retarder.

To avoid bending the confining web 200, 205, the confining web 200, 205 has a parallel width $b_2$ in the direction of the upper side 55 of the semiconductor component 20, with a value of 0.1 µm to 0.8 µm. The confining layer 35, and in this case in particular the confining web 200, 205, has a height h perpendicularly to the upper side 55 with a value of 0.1 µm to 2 µm, particularly 0.2 µm to 1 µm, particularly advantageously 0.1 µm to 0.5 µm. In this way, the volume of the reservoir 70 can be kept small, and at the same time optical detectability of the marker material 15 in the ink process can be ensured.

If the marker material 15 is introduced into the reservoir 70 in the scope of the ink process, the marker material 15 may have a different shape depending on the filling quantity. In the example, the filling quantity of the marker material 15 is selected such that the marker material 15 has, on the upper side, a dome-shaped upper side 230 extending between the confining webs 200, 205. Because of the surface tension of the marker material 15, the liquid marker material 15 does not flow out of the reservoir 70 before curing.

Figure 8:
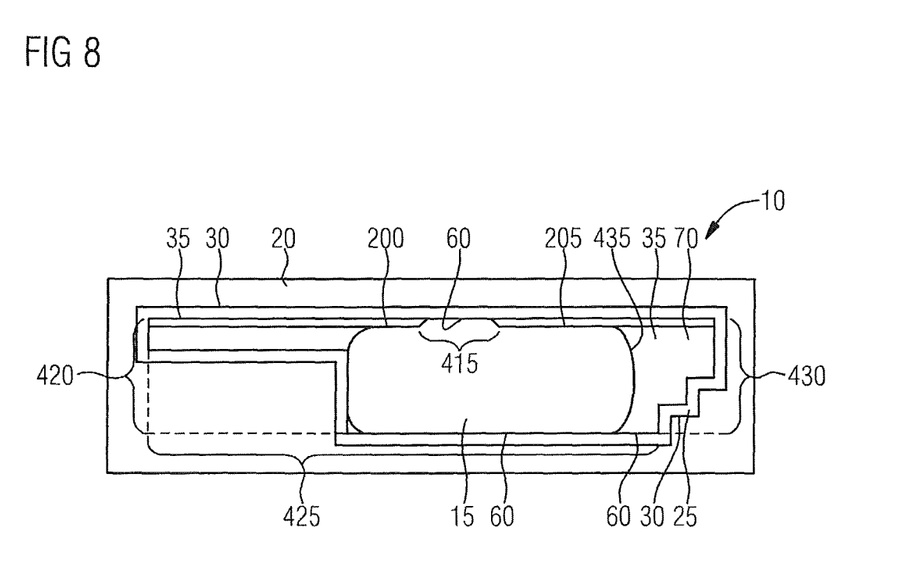
FIG. 8 represents a plan view of an arrangement according to a third example.

FIG. 8 shows a plan view of an arrangement according to a third example.

The arrangement 10 is configured similarly to the arrangements 10 shown in FIGS. 2 to 7. In the arrangement shown in FIG. 8, the arrangements 10 shown in FIGS. 2 to 7 are combined with one another. Furthermore, both the metallization layer 25 and the confining layer 35 have a different exemplary geometrical configuration.

The confining layer 35 is arranged on the metallization layer 25, and delimits an elongately configured reservoir 70 for the marker material 15. To delimit the reservoir 70, the confining layer 35 comprises the confining webs 200, 205 and a plurality of sections 415, 420, 425, 430 of the confining edge 60.

The first confining web 200 and the second confining web 205 are in this case arranged extending in a common plane, separated laterally from the second outer contour 30 of the metallization layer 25. Furthermore, the first confining web 200 is arranged separated from the second confining web 205 in the plane.

A first section 415 of the confining edge 60 is arranged between the two confining webs 200, 205. The first section 415 laterally closes the reservoir 70 between the first confining web 200 and the second confining web 205. The first section 415 is configured in a straight line. Depending on the example selected, a plurality of confining webs 200, 205 separated from one another by first sections 415 may be provided, these webs delimiting at least one side of the reservoir 70. At least one interruption of a confining web may therefore be provided, or multiple interruptions of a confining web 220, 205 may be provided.

On the left-hand side in FIG. 8, by way of example, the reservoir 70 is delimited by a second section 420 of the confining edge 60. The second section 420 is, for example, arranged in sections at a right angle to the first confining web 200 and extends in a stepped manner. Opposite the first section 415 and the two confining webs 200, 205, a third section 425, extending by way of example in a stepped manner, of the confining edge 60 is provided. The second section 420 adjoins the third section 425. On the right-hand side, opposite the second section 420, a fourth section 430 of the confining edge 60 to delimit the reservoir 70 is provided. The fourth section 430 is configured in a stepped manner, and adjoins the second confining web 205 and the third section 425.

In the example, a smaller filling quantity of the marker material 15 is introduced into the reservoir 70 than the maximum which can be introduced into the reservoir 70. After introduction of the marker material 15 into the reservoir 70, the liquid marker material 15 is distributed in the reservoir 70 as a function of its viscosity. In this case, the confining edge 60 and the confining webs 200, 205 prevent lateral flow of the marker material 15 out of the reservoir 70. Because of the selected filling quantity of the marker material 15, the marker material 15 extends only partially over the surface 50 of the confining layer 35 in the reservoir 70 so that, for example, an edge 435 of the marker material 15 is separated from the fourth section 430 of the confining edge 60, and the marker material 15 is delimited only in sections by the second section 420.

By the confining layer 35 provided on the metallization layer 25, a defined geometrical configuration of the marker material 15 on the metallization layer 25 can be achieved so that the optical image acquisition device can reliably detect the arrangement 10 marked with marker material. Furthermore, the metallization layer 25 can be geometrically configured independently of the geometrical configuration of the reservoir 70. Free configurability and controlled adaptation of the metallization layer 25 to the electrical properties to be satisfied can therefore be made possible. In particular, a high aspect ratio of the reservoir 70 can be achieved so that the image acquisition device can better detect the arrangement 10 comprising marker material. This is advantageous particularly for laser diodes emitting electromagnetic radiation in the range of a range visible to the human eye.

The configuration of the arrangement 10 as described in FIGS. 1 to 8 ensures that, in the ink process, cross-contamination of neighboring arrangements 10 on the wafer 1 by the marker material 15 is prevented, for example, if an excessively large filling quantity of marker material 15 is mistakenly introduced into the reservoir 70 and/or the arrangement 10 to be provided with marker material 15 has breaks.

Due to the improved detectability by image acquisition devices of arrangements 10 in which the marker material 15 is introduced in the reservoir 70, manual rechecking, in particular of cross-contaminated arrangements 10, can be reduced. Furthermore, besides manual rechecking, rejection is also reduced.

Although our arrangements have been illustrated and described in detail by the preferred examples, this disclosure is not restricted by the examples disclosed and other variants may be derived therefrom by those skilled in the art without departing from the protective scope of the appended claims.

This application claims priority of DE 10 2015 105 752.2, the subject matter of which is incorporated herein by reference.

The invention claimed is:

1. An arrangement comprising:
a confining layer, a metallization layer, a marker material and a semiconductor component,
wherein the metallization layer is directly arranged on the semiconductor component,
wherein the metallization layer is configured to contact the semiconductor component,
wherein the confining layer is directly arranged on the metallization layer,
the confining layer spatially establishes a reservoir for the marker material at least partially in a defined manner,
the confining layer and the metallization layer consist of the same material, and
the marker material comprises ink and the marker material is arranged in the reservoir of the arrangement.

2. The arrangement as claimed in claim 1,
wherein the confining layer laterally comprises a side face and a surface on the upper side,
the side face and the surface form a confining edge, and
the confining edge at least partially delimits the reservoir.

3. The arrangement as claimed in claim 2, wherein the side face has an extent perpendicularly to the surface with a value of 0.1 µm to 4 µm.

4. The arrangement as claimed in claim 2,
wherein the metallization layer has an outer contour,
the outer contour has a margin beyond the confining edge,
wherein the confining edge is arranged offset inward relative to the outer contour, and
the margin has a width with a value of 1 µm to 15 µm.

5. The arrangement as claimed in claim 1,
wherein the confining layer comprises a first confining web and a second confining web,
wherein the first confining web and the second confining web are directly arranged on an upper side of the metallization layer,
the first and second confining web extends in a direction facing away from the semiconductor component, and
the first confining web at least partially delimits the reservoir,
wherein the first confining web has a laterally arranged first confining face, and the second confining web has a laterally arranged second confining face,
wherein the first confining face is arranged opposite the second confining face,
wherein the first and second confining faces and the upper side of the metallization layer delimit the reservoir,
wherein the reservoir is opened upward.

6. The arrangement as claimed in claim 5,
wherein the first confining web has a width of 0.1 µm to 0.8 µm, and
wherein the first confining web has a height of 0.1 µm to 2 µm.

7. The arrangement as claimed in claimed in claim 5,
wherein
the confining face encloses an angle with the upper side of the metallization layer, and
the angle has a value of 40° to 90°.

8. The arrangement as claimed in claim 5,
wherein between the first and the second confining web the confining edge is arranged,
wherein the confining edge provides an interruption of the first and the second confining web,
wherein the confining edge and the first and the second confining web limit the reservoir.

9. The arrangement as claimed in claim 1, wherein the semiconductor component is an optoelectronic semiconductor component and comprises at least one laser diode.

10. The arrangement as claimed in claim 1, wherein the marker material comprises at least one of: epoxy resin, adhesive, water and plastic.

11. The arrangement as claimed in claim 1, wherein the marker material has a viscosity of 300 mPa*s to 500 mPa*s.

12. A method of producing the arrangement according to claim 1 comprising:
providing a wafer and a plurality of arrangements on the wafer,
checking each arrangement for functionality on the wafer,
introducing the marker material comprising in a liquid state into the reservoir of the arrangement in a liquid state which is defective or functional to mark the defective arrangement or the functional arrangement,
selecting a filling quantity of the marker material such that a maximum volume of the reservoir is not exceeded,
detecting the arrangements on the wafer by an optical image acquisition device,
distinguishing the arrangement with marker material in the reservoir from arrangements without marker material in the reservoir,
separating the individual arrangements from one another by sawing the wafer, and
discriminating the marked arrangement from the unmarked arrangement.

13. An arrangement comprising:
a confining layer, a metallization layer, a second metallization layer, a marker material and a semiconductor component,
wherein the first metallization layer is directly arranged on the semiconductor component,
wherein the second metallization layer is directly arranged on the first metallization layer, and the confining layer is directly arranged on the second metallization layer,
the confining layer spatially establishes a reservoir for the marker material at least partially in a defined manner,
the confining layer and the first metallization layer and the second metallization layer consist of an identical material, and
the marker material comprises ink and is arranged in liquid state in the reservoir of the arrangement.

14. The arrangement as claimed in claim 13,
comprising a configuration stepped upward in a cascaded manner from the semiconductor component to the confining layer, preventing in case the fluid marker material were to flow from the confining layer onto the second metallization layer, the second metallization layer acts as a further confining layer and further containments with the marker material are prevented by the second metallization layer.

15. The arrangement as claimed in claim 13,
wherein the semiconductor component comprises a first outer contour,
wherein the first metallization layer comprises a second outer contour, and the second metallization layer comprises a third outer contour,
wherein second outer contour of the first metallization layer is selected in such a way that the second outer contour extends inside the first outer contour of the semiconductor component, so that the first metallization layer has a smaller extent than the semiconductor component in an extent direction parallel to an upper side of the semiconductor component,
wherein the third outer contour is selected in such a way that the third outer contour lies inside the second outer contour of the first metallization layer, so that the second metallization layer has a smaller extent than the first metallization layer in an extent direction parallel to the upper side of the semiconductor component,
wherein the third outer contour of the metallization layer has a margin beyond a confining edge of the confining layer, so that the confining edge is arranged offset inward relative to the third outer contour.

16. The arrangement as claimed in claim 13,
wherein the first metallization layer, the second metallization layer and the confining layer are configured to be differently thick in a direction perpendicular to the surface of the semiconductor component.

17. The arrangement as claimed in claim 2, wherein the upper surface is planar and extends planar over an entire width of the upper side of the confining layer.

18. The arrangement as claimed in claim 5,
wherein the first confining web and the second confining web are arranged extending fully around the reservoir.

19. The arrangement as claimed in claim 5,
wherein the first confining web is arranged at a lateral distance a from an outer contour of the metallization layer and ensures that, even in an event of unintentional flow of marker material beyond the confining web, the metallization layer acts as a flow retarder.

20. The arrangement as claimed in claim 6,
wherein the distance comprises a value in a range of from 5 μm to 15 μm, particularly advantageously in a range of from 5 μm to 10 μm.

* * * * *